US012334808B2

(12) United States Patent
Takubo et al.

(10) Patent No.: US 12,334,808 B2
(45) Date of Patent: Jun. 17, 2025

(54) DRIVE DEVICE, DRIVE METHOD, AND POWER CONVERSION DEVICE

(71) Applicant: FUJI ELECTRIC CO., LTD., Kanagawa (JP)

(72) Inventors: Hiromu Takubo, Tokyo (JP); Ryoga Kiguchi, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 326 days.

(21) Appl. No.: 17/936,945

(22) Filed: Sep. 30, 2022

(65) Prior Publication Data

US 2023/0130625 A1 Apr. 27, 2023

(30) Foreign Application Priority Data

Oct. 21, 2021 (JP) .................................. 2021-172459
May 18, 2022 (JP) .................................. 2022-081654

(51) Int. Cl.
*H02M 1/08* (2006.01)
*H02M 1/38* (2007.01)
*H03K 17/16* (2006.01)
*H03K 17/687* (2006.01)
*H02M 7/537* (2006.01)

(52) U.S. Cl.
CPC ............. *H02M 1/08* (2013.01); *H02M 1/385* (2021.05); *H03K 17/161* (2013.01); *H03K 17/687* (2013.01); *H02M 7/537* (2013.01)

(58) Field of Classification Search
CPC ...... H02M 1/08; H02M 1/385; H03K 17/161; H03K 17/687
See application file for complete search history.

(56) References Cited

U.S. PATENT DOCUMENTS

| 10,651,719 | B2 * | 5/2020 | Gloes | H03K 17/6871 |
| 11,848,599 | B2 * | 12/2023 | Kimura | H03K 17/08142 |
| 12,088,283 | B2 * | 9/2024 | Li | H03K 17/0406 |
| 2008/0265975 | A1 | 10/2008 | Takasu et al. | |

FOREIGN PATENT DOCUMENTS

| JP | 2008-278552 | 11/2008 |
| JP | 2017-051049 | 3/2017 |
| JP | 2018-133892 | 8/2018 |

* cited by examiner

*Primary Examiner* — Kyle J Moody
(74) *Attorney, Agent, or Firm* — IPUSA, PLLC

(57) ABSTRACT

According to the present disclosure, the deterioration of SiC-MOSFETs is suppressed. A drive device switches between a first SiC-MOSFET and a second SiC-MOSFET that are connected in series, with a dead time where the first SiC-MOSFET and the second SiC-MOSFET are commanded to be OFF being provided in between. This drive device includes: a first drive circuit configured to set the gate voltage of the first SiC-MOSFET, during the dead time, to a first middle voltage that is higher than a first negative power supply voltage and lower than a first threshold voltage for the first SiC-MOSFET; and a second drive circuit configured to set the gate voltage of the second SiC-MOSFET, during the dead time, to a second middle voltage that is higher than a second negative power supply voltage and lower than a second threshold voltage for the second SiC-MOSFET.

9 Claims, 10 Drawing Sheets

DRIVE DEVICE, DRIVE METHOD, AND POWER CONVERSION DEVICE

CROSS-REFERENCE TO RELATED APPLICATIONS

This application is based upon and claims priority to Japanese Patent Application No. 2021-172459, filed on Oct. 21, 2021, and Japanese Patent Application No. 2022-081654, filed on May 18, 2022, the entire contents of which are incorporated herein by reference.

BACKGROUND OF THE INVENTION

1. Field of the Invention

This disclosure relates to a drive device, a drive method, and a power conversion device.

2. Description of the Related Art

Conventionally, there is a power conversion circuit, in which two serially-connected switching elements are connected in parallel to a DC power supply. As described in Patent Document 1 below, such a power conversion circuit is known to bias both gate voltages of the two switching elements in the negative direction so that the switching elements do not turn on at the same time during the dead time period.

RELATED-ART DOCUMENT

Patent Document

Patent Document 1: Unexamined Japanese Patent Application Publication No. 2017-51049

A SiC-MOSFET has a problem that its characteristics deteriorate when a current flows in the body diode. When the driving method of Patent Document 1 is applied to the driving of a SiC-MOSFET, a current might flow into the body diode of the SiC-MOSFET during the dead time, and the deterioration of the SiC-MOSFET might progress.

The present disclosure therefore provides a drive device and a drive method for suppressing the deterioration of a SiC-MOSFET, and a power conversion device including the drive device.

SUMMARY OF THE INVENTION

One aspect of the present disclosure provides a drive device. This drive device switches between a first SiC-MOSFET (Silicon-Carbide Metal-Oxide-Semiconductor Field-Effect-Transistor) and a second SiC-MOSFET that are connected in series, with a dead time where the first SiC-MOSFET and the second SiC-MOSFET are commanded to be OFF being provided in between. The drive device has: a first drive circuit configured to set the gate voltage of the first SiC-MOSFET, during the dead time, to a first middle voltage that is higher than a first negative power supply voltage and lower than a first threshold voltage for the first SiC-MOSFET; and a second drive circuit configured to set the gate voltage of the second SiC-MOSFET, during the dead time, to a second middle voltage that is higher than a second negative power supply voltage and lower than a second threshold voltage for the second SiC-MOSFET. Also, a power conversion device including the above drive device is provided.

According to the present disclosure, the deterioration of a SiC-MOSFET can be suppressed.

DESCRIPTION OF THE PREFERRED EMBODIMENTS

Below, an embodiment will be described.

Figure 1:
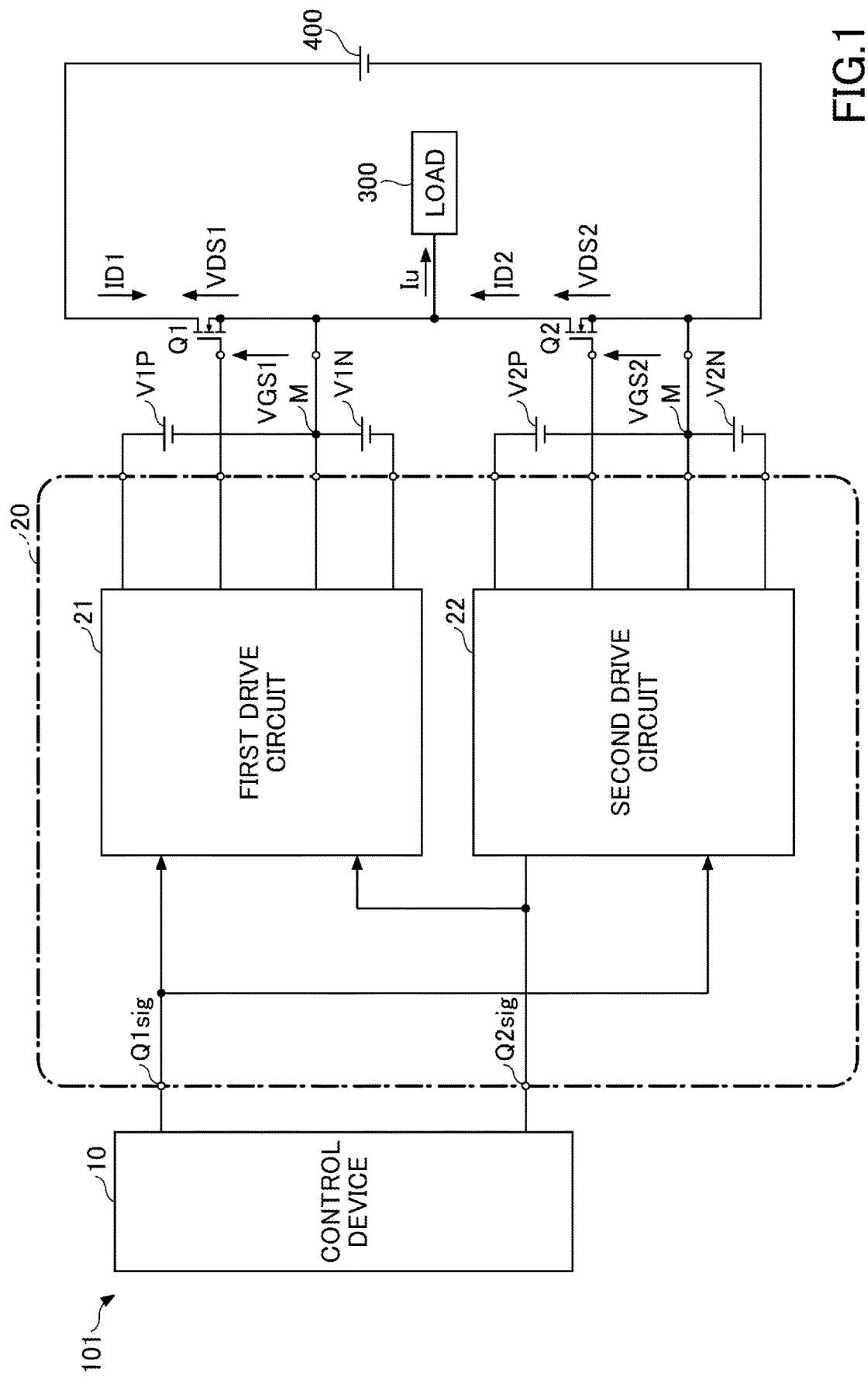
FIG. 1 is a diagram showing an example configuration of a power conversion device according to one embodiment.

FIG. 1 is a diagram showing an example configuration of a power conversion device according to one embodiment. The power conversion device 101 shown in FIG. 1 may be an inverter that converts direct current into alternating current, or may be a converter that converts direct current into direct current. For example, the power conversion device 101 is an inverter that converts DC power supplied from a DC power supply 400 into AC power to be supplied to a load 300 such as a motor. The power conversion device 101 includes a control device 10, a drive device 20, an upper arm Q1, a lower arm Q2, and a DC power supply 400.

FIG. 1 shows arms for one phase, in which upper arm Q1 and lower arm Q2 are connected in series, and a drive device 20 for one phase for driving the arms. When the power conversion device 101 is, for example, an inverter that generates three-phase AC power with U, V, and W phases, the power conversion device 101 includes arms for three phases, having the same configuration as the arms shown in FIG. 1, and a drive device for three phases, having the same configuration as the drive device 20 shown in FIG. 1. The connection point between upper arm Q1 on the high side and lower arm Q2 on the low side is connected to the load 300.

Following command signals Q1*sig* and Q2*sig* supplied from the control device 10, the drive device 20 switches between upper arm Q1 and lower arm Q2, with a dead time for turning off serially-connected upper arm Q1 and lower arm Q2 in between. Command signal Q1*sig* is a control signal that commands the ON or OFF period of upper arm Q1. Command signal Q2*sig* is a control signal that commands the ON or OFF period of lower arm Q2. The drive device 20 has a first drive circuit 21 and a second drive circuit 22.

The first drive circuit 21 drives upper arm Q1 in accordance with command signals Q1*sig* and Q2*sig*. The first drive circuit 21 switches a gate-source voltage VGS1 of upper arm Q1 to a first positive power supply voltage V1P or a first negative power supply voltage V1N. The second drive circuit 22 drives lower arm Q2 in accordance with command signals Q1*sig* and Q2*sig*. The second drive circuit 22 switches a gate-source voltage VGS2 of lower arm Q2 to a second positive power supply voltage V2P or a second negative power supply voltage V2N.

Both upper arm Q1 and lower arm Q2 are SiC-MOSFETs having a gate, a source, and a drain. SiC is silicon carbide, and MOSFET is an abbreviation for a metal oxide film semiconductor field effect transistor. A SiC-MOSFET has a channel part between the source and the drain, and has a body diode, in which the direction from the source to the drain is the forward direction. Upper arm Q1 is an example of the first SiC-MOSFET. Lower arm Q2 is an example of the second SiC-MOSFET.

Next, the operation of the power conversion device 101 when the drive method that the drive device 20 performs is used to drive the power conversion device 101 for one phase (for example, the U-phase arm) will be described below. Note that, for the two phases (for example, the V phase and the W phase) other than the one described below, the power conversion device 101 operates in the same manner, and therefore the following description of the operation of the power conversion device 101 for one phase applies equally to the operation for the other two phases as well.

First, a driving method according to a comparative example will be described for comparison with the driving method of the present disclosure.

Figure 2:
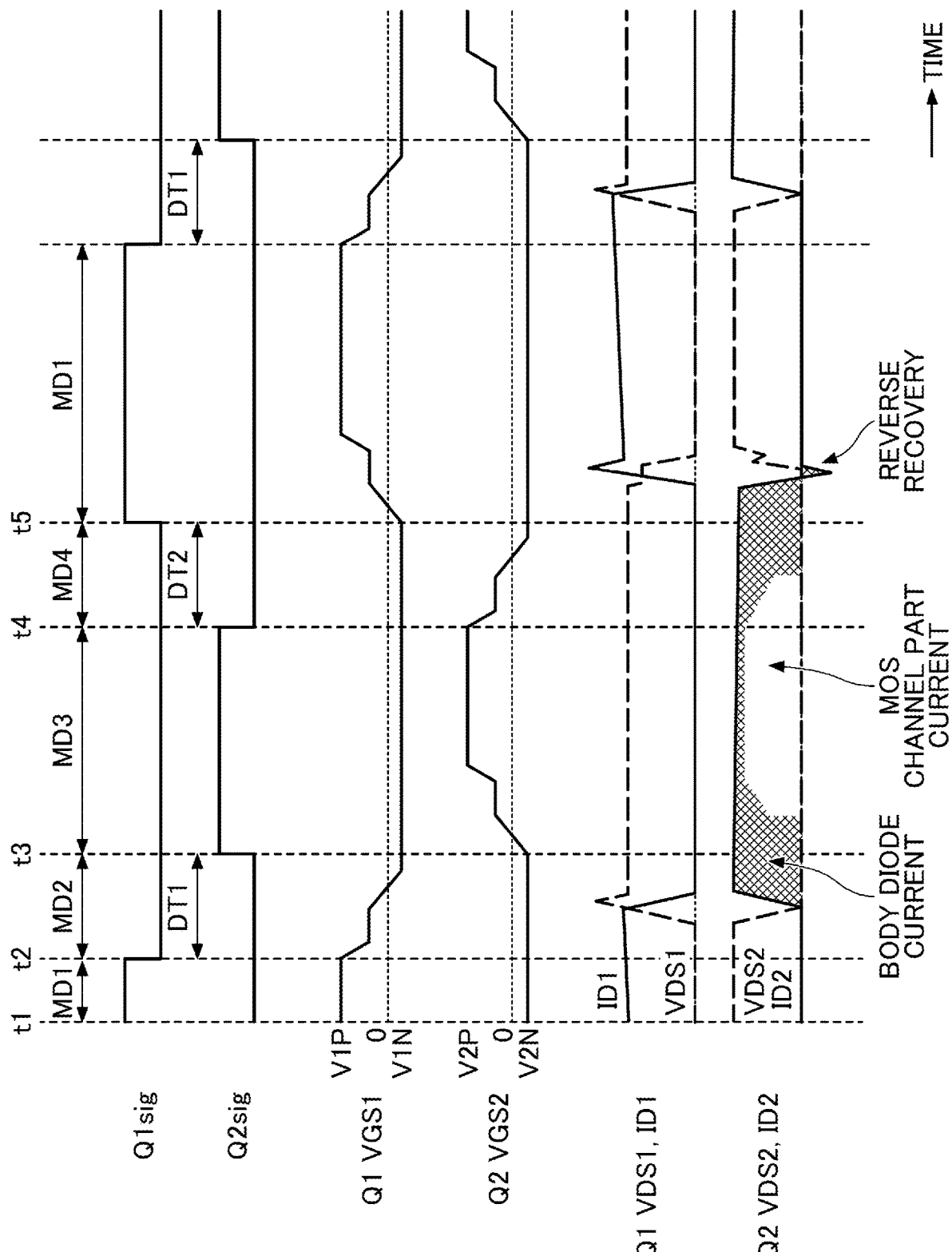
FIG. 2 is a timing chart showing an operation according to a driving method of a comparative example.

FIG. 2 is a timing chart showing the operation according to the driving method of the comparative example. Note that, in the following description of FIG. 2, the reference codes and numerals of the power conversion device 101 shown in FIG. 1 will be used for ease of explanation. As shown in FIG. 2, the switching operation of the power conversion device 101 for one phase is divided into four operations, namely, a mode MD1, a mode MD2, a mode MD3, and a mode MD4.

In the operation of mode MD1 from a time point t1 to a time point t2, command signal Q1*sig* assumes the high level, and command signal Q2*sig* assumes the low level. Consequently, gate-source voltage VGS1 of upper arm Q1 has the same voltage as a first positive power supply voltage V1P, and gate-source voltage VGS2 of lower arm Q2 has the same voltage as second negative power supply voltage V2N.

This places upper arm Q1 in the ON state and lower arm Q2 in the OFF state, and a drain current ID1 of upper arm Q1 flows in the U-phase coil of the load 300 as an output current Iu. As a result of this, drain current ID1 of upper arm Q1 increases, and output current Iu also increases gradually. Also, output current Iu assumes a positive value. In mode MD1, lower arm Q2 is in the OFF state, so that the value of a drain current ID2 is 0 [A].

Next, at time point t2, the switching operation of the power conversion device 101 for one phase switches from mode MD1 to mode MD2. Mode MD2 is a mode in which, in order to provide a first dead time DT1, upper arm Q1 is switched from the ON state to the OFF state, and upper arm Q1 and lower arm Q2 are both placed in the OFF state. First dead time DT1 is a period for preventing upper arm Q1 and lower arm Q2 from being in the ON state at the same time, and a through current from flowing between upper arm Q1 and lower arm Q2.

In the operation of mode MD2, gate-source voltage VGS1 of upper arm Q1 has the same voltage as first negative power supply voltage V1N after the mirror period, and gate-source voltage VGS2 of lower arm Q2 has the same voltage as second negative power supply voltage V2N. Consequently, upper arm Q1 switches from the ON state to the OFF state, and lower arm Q2 maintains its OFF state. Consequently, upper arm Q1 and lower arm Q2 are both in the OFF state.

At this time, a freewheeling current that flows through the body diode built in lower arm Q2 flows to the load 300 as output current Iu. Since this freewheeling current is a current that is based on the inductance of the load 300 and the like, output current Iu decreases gradually while maintaining a positive value. This freewheeling current is a current that passes through the body diode built in lower arm Q2, and corresponds to a drain current ID2 that flows from the source to the drain of lower arm Q2. On the other hand, in mode MD2, upper arm Q1 enters the OFF state, and so drain current ID1 of upper arm Q1 decreases down to 0 [A].

Subsequently, at time point t3, the switching operation of the power conversion device 101 for one phase switches from mode MD2 to mode MD3. Mode MD3 is a mode in which lower arm Q2 switches from the OFF state to the ON state, and in which a freewheeling current flows in both the channel part and the body diode of lower arm Q2.

In mode MD3, command signal Q2*sig* is inverted from the low level to the high level. Second positive power supply voltage V2P is applied to the gate of lower arm Q2, and a reference potential M is applied to the source of lower arm Q2, so that gate-source voltage VGS2 of lower arm Q2 becomes second positive power supply voltage VP2. As a result of this, a forward bias voltage is output to gate-source voltage VGS2 of lower arm Q2, so that lower arm Q2 switches from the OFF state to the ON state. When lower arm Q2 enters the ON state, the freewheeling current flows in both the channel part and the body diode of lower arm Q2. Consequently, in lower arm Q2 in mode MD3, the ON resistance of the channel part and the ON resistance of the body diode are connected in parallel, and the resistance becomes lower than that of mode MD2, in which the freewheeling current flows in the body diode alone. Note that, in mode MD3, upper arm Q1 remains in the OFF state.

Since the freewheeling current in mode MD3 is a current that is based on the inductance of the load 300 and the like as in mode MD2, the current value of the freewheeling current gradually approaches 0 [A]. As a result of this, output current Iu decreases gradually while maintaining a positive value.

Subsequently, at time point t4, mode MD3 switches to mode MD4. Mode MD4 is a mode in which, similarly to mode MD2 described above, in order to provide a second dead time DT2, lower arm Q2 is switched from the ON state to the OFF state, and upper arm Q1 and lower arm Q2 are both placed in the OFF state. Second dead time DT2 is a period for preventing a situation in which upper arm Q1 and lower arm Q2 enter the ON state at the same time, and a through current flows between upper arm Q1 and lower arm Q2.

In the operation of mode MD4, gate-source voltage VGS2 of lower arm Q2 has the same voltage as second negative power supply voltage V2N after the mirror period, and gate-source voltage VGS1 of upper arm Q1 has the same voltage as first negative power supply voltage V1N. Consequently, lower arm Q2 switches from the ON state to the OFF state, and upper arm Q1 remains in the OFF state. Consequently, upper arm Q1 and lower arm Q2 both enter the OFF state.

At this time, a freewheeling current that flows through the body diode built in lower arm Q2 flows in the load 300 as output current Iu. Since this freewheeling current is a current based on the inductance of the load 300 and the like, output current Iu decreases gradually while maintaining a positive value. Also, in mode MD4, upper arm Q1 enters the OFF state, so that drain current ID1 of upper arm Q1 is maintained at 0 [A]. On the other hand, this freewheeling current is a current that passes through the body diode built in lower arm Q2, and corresponds to drain current ID2 that flows from the source to the drain of lower arm Q2.

Subsequently, at time point t5, the switching operation of the power conversion device 101 for one phase switches from mode MD4 to mode MD1. In this mode MD1, as described earlier, upper arm Q1 enters the ON state, and lower arm Q2 remains in the OFF state.

In this mode MD1, command signal Q1sig is inverted from the low level to the high level, and command signal Q2sig maintains the low level. Consequently, upper arm Q1 switches from the OFF state to the ON state, drain-source voltage VDS1 of upper arm Q1 drops from first positive power supply voltage V1P to "0," and drain current ID1 rises in the positive direction from zero (the direction from the drain to the source).

On the low side, on the other hand, while lower arm Q2 remains in the OFF state, by turning upper arm Q1 on, a high dv/dt is generated in lower arm Q2 (that is, drain source voltage VDS2 rises sharply), and a reverse recovery current due to the high dv/dt flows into the body diode of lower arm Q2. After the reverse recovery current settles, drain current ID2 becomes zero.

However, as described earlier, in dead times DT1 and DT2, the freewheeling current that flows only in the body diode of lower arm Q2 may cause deterioration of lower arm Q2, which is a SiC-MOSFET. Also, the ON voltage (forward voltage) of the body diode is also relatively high, and might serve as a factor to increase the loss of lower arm Q2.

Figure 3:
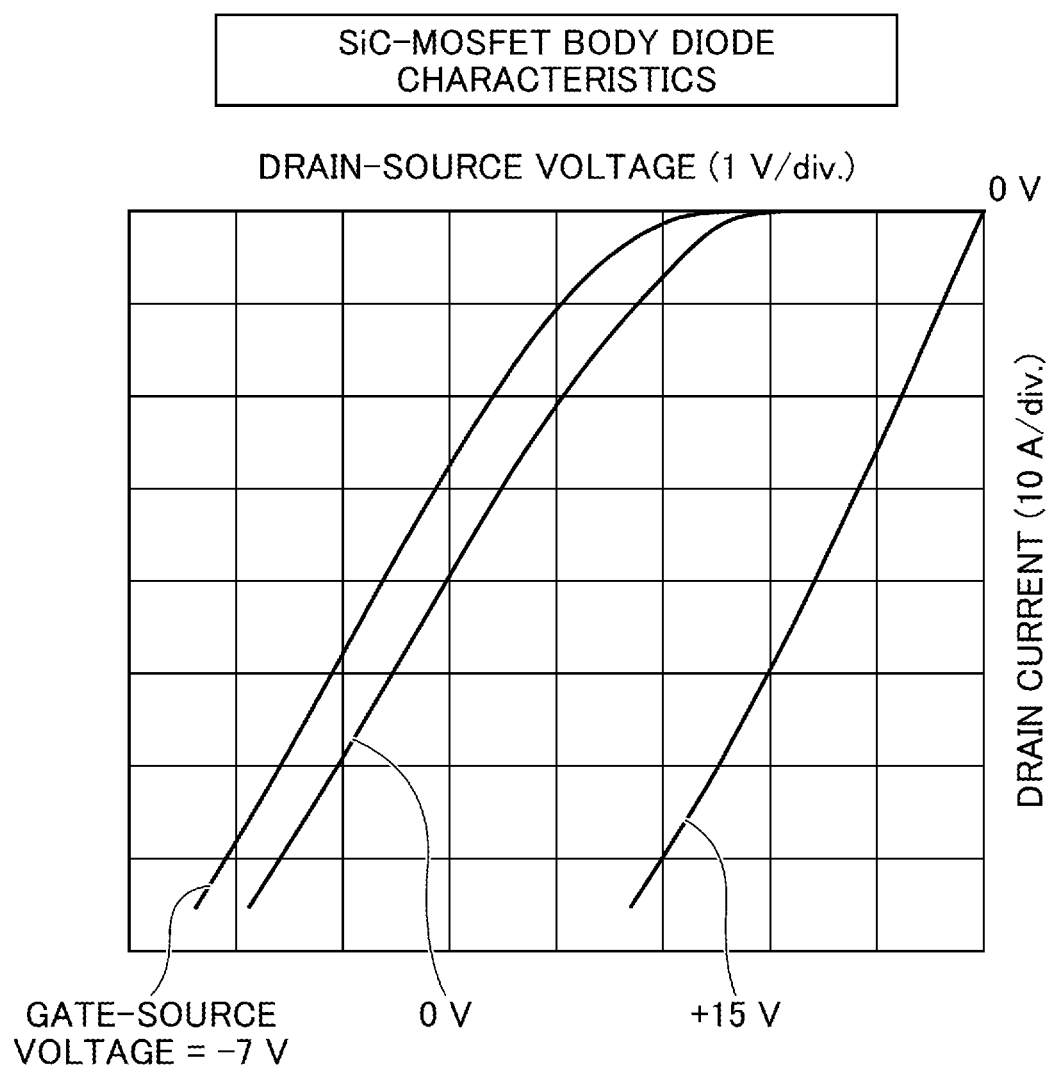
FIG. 3 is a diagram showing example characteristics of a body diode of a SiC-MOSFET.

FIG. 3 is a diagram showing an example of the characteristics of the body diode of a SiC-MOSFET. The drain-source voltage (voltage across the body diode) on the horizontal axis of FIG. 3 indicates the voltage at the drain as seen from the source, and therefore is represented by a negative value. When the gate-source voltage is increased, the drain-source voltage (voltage across the body diode) decreases, so that the loss decreases. In the driving method of FIG. 2 described above, a reverse bias (negative power supply voltage) is applied between the gate and the source during dead times, which entails significant loss. Focusing on this point, the driving method of the present disclosure sets the voltage (gate voltage) to apply between the gate and the source of an SiC-MOSFET during dead times to a middle voltage that is higher than the negative power supply voltage and lower than the threshold voltage for the SiC-MOSFET. As a result of this, the ON voltage (forward voltage) of the body diode decreases, so that the loss of the body diode is reduced, and the deterioration of the SiC-MOSFET can be suppressed.

Figure 4:
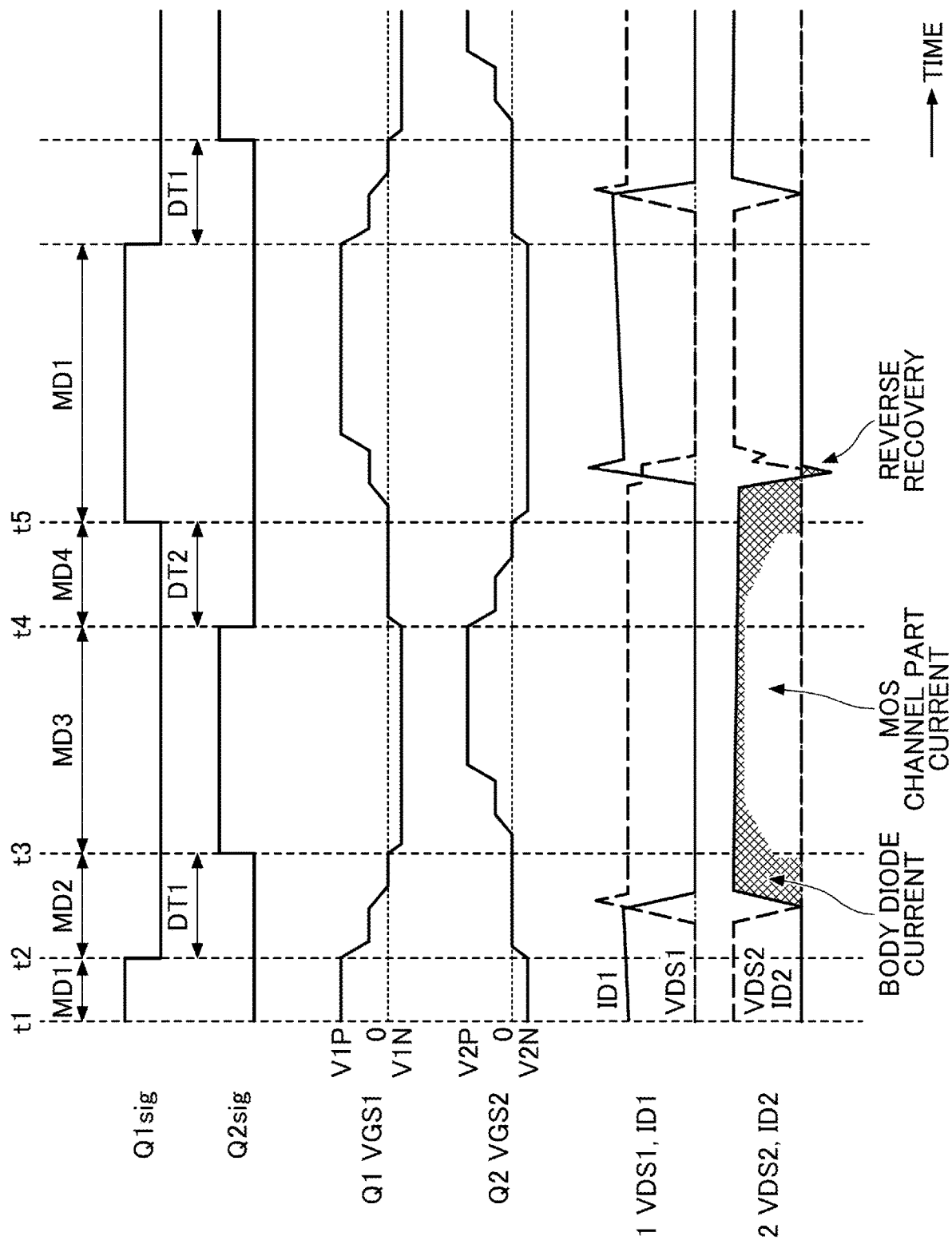
FIG. 4 is a timing chart showing an operation according to the first driving method of the present disclosure.

FIG. 4 is a timing chart showing the operation according to the first driving method of the present disclosure. Note that, in the following description of FIG. 4, the reference codes and numerals of the power conversion device 101 shown in FIG. 1 will be used for ease of explanation. As shown in FIG. 4, the switching operation of the power conversion device 101 for one phase is divided into four operations, namely, mode MD1, mode MD2, mode MD3, and mode MD4.

In the operation of mode MD1 from time point t1 to time point t2, command signal Q1sig assumes the high level, and command signal Q2sig assumes the low level. Consequently, gate-source voltage VGS1 of upper arm Q1 has the same voltage as first positive power supply voltage V1P, and gate-source voltage VGS2 of lower arm Q2 has the same voltage as second negative power supply voltage V2N.

This places upper arm Q1 in the ON state and lower arm Q2 in the OFF state, and drain current ID1 of upper arm Q1 flows in the U-phase coil of the load 300 as output current Iu. As a result of this, drain current ID1 of upper arm Q1 increases, and output current Iu also increases gradually. Also, output current Iu assumes a positive value. In mode MD1, lower arm Q2 is in the OFF state, so that the value of drain current ID2 is 0 [A].

Thus, in mode MD1, the first drive circuit 21 sets the gate voltage of upper arm Q1 to first positive power supply voltage V1P, and the second drive circuit 22 sets the gate voltage of lower arm Q2 to second negative power supply voltage V2N.

Following this, at time point t2, the switching operation of the power conversion device 101 for one phase switches from mode MD1 to mode MD2. Mode MD2 is a mode for providing first dead time DT1. First dead time DT1 is a period that is located immediately after the ON-commanding period for upper arm Q1 by command signal Q1sig and immediately before the ON-commanding period for lower arm Q2 by command signal Q2sig.

In the operation of mode MD2, gate-source voltage VGS1 of upper arm Q1 becomes first middle voltage VM1 after the mirror period, and gate-source voltage VGS2 of lower arm Q2 becomes second middle voltage VM2. First middle voltage VM1 is a voltage that is higher than first negative power supply voltage V1N and lower than the first threshold voltage for upper arm Q1, and is zero volt in the example shown in FIG. 4. Second middle voltage VM2 is a voltage that is higher than second negative power supply voltage V2N and lower than the second threshold voltage for lower arm Q2, and is zero volt in the example shown in FIG. 4.

At this time, second middle voltage VM2 is zero, and so the channel part of lower arm Q2 opens slightly. As a result of this, the circulating current (freewheeling current) that flows in mode MD2 flows in both the channel part and the body diode of lower arm Q2. Consequently, in lower arm Q2 in mode MD2, the ON resistance of the channel part and the ON resistance of the body diode are connected in parallel. As a result of this, the drain-source voltage of lower arm Q2 decreases, so that the loss of lower arm Q2 decreases. Also, since a rectified current (freewheeling current) is shunted between the body diode and the channel part, the current to flow in the body diode decreases in proportion, and so the progress of deterioration due to the current flowing in the body diode can be suppressed.

The freewheeling current that flows through the channel part and the body diode of lower arm Q2 in mode MD2 flows to the load 300 as output current Iu. Since this freewheeling current is a current that is based on the inductance of the load 300 and the like, output current Iu decreases gradually while maintaining a positive value. This freewheeling current is a current that passes through the channel part and the body diode of lower arm Q2, and corresponds to drain current ID2 that flows from the source to the drain of lower arm Q2. On the other hand, in mode MD2, upper arm Q1 enters the OFF state, and so drain current ID1 of upper arm Q1 decreases down to 0 [A].

As described above, in mode MD2, when first dead time DT1 starts, the first drive circuit 21 changes the gate voltage of upper arm Q1 from first positive power supply voltage V1P to first middle voltage VM1. On the other hand, the second drive circuit 22 changes the gate voltage of lower arm Q2 from second negative power supply voltage V2N to second middle voltage VM2 when first dead time DT1 starts.

Subsequently, at time point t3, the switching operation of the power conversion device 101 for one phase switches from mode MD2 to mode MD3. Mode MD3 is a mode in which lower arm Q2 switches from the OFF state to the ON state, and in which a freewheeling current flows in both the channel part and the body diode of lower arm Q2.

In mode MD3, command signal Q2*sig* is inverted from the low level to the high level. Second positive power supply voltage V2P is applied to the gate of lower arm Q2, and a reference potential M is applied to the source of lower arm Q2, so that gate-source voltage VGS2 of lower arm Q2 becomes second positive power supply voltage VP2. As a result of this, a forward bias voltage is output to gate-source voltage VGS2 of lower arm Q2, so that lower arm Q2 switches from the OFF state to the ON state. When lower arm Q2 enters the ON state, the freewheeling current flows in both the channel part and the body diode of lower arm Q2. Consequently, in lower arm Q2 in mode MD3, the ON resistance of the channel part and the ON resistance of the body diode are connected in parallel, and the resistance becomes lower than that of mode MD2, in which the freewheeling current flows in the body diode alone. Note that, in mode MD3, upper arm Q1 remains in the OFF state.

Since the freewheeling current in mode MD3 is a current that is based on the inductance of the load 300 and the like as in mode MD2, the current value of the freewheeling current gradually approaches 0 [A]. As a result of this, output current Iu decreases gradually while maintaining a positive value.

Thus, in mode MD3, when first dead time DT1 ends, the first drive circuit 21 changes the gate voltage of upper arm Q1 from first middle voltage VM1 to first negative power supply voltage V1N. On the other hand, the second drive circuit 22 changes the gate voltage of lower arm Q2 from second middle voltage VM2 to second positive power supply voltage V2P when first dead time DT1 ends.

Subsequently, at time point t4, mode MD3 switches to mode MD4. Mode MD4 is a mode for providing second dead time DT2, similarly to mode MD2 described above. The second dead time DT is a period located immediately after the ON-commanding period for lower arm Q2 by command signal Q2*sig* and immediately before the ON-commanding period for upper arm Q1 by command signal Q1*sig*.

In the operation of mode MD4, gate-source voltage VGS2 of lower arm Q2 becomes second middle voltage VM2 after the mirror period, and gate-source voltage VGS1 of upper arm Q1 becomes first middle voltage VM1. First middle voltage VM1 is a voltage that is higher than first negative power supply voltage V1N and lower than the first threshold voltage for upper arm Q1, and is zero volt in the example shown in FIG. 4. Second middle voltage VM2 is a voltage that is higher than second negative power supply voltage V2N and lower than the second threshold voltage for lower arm Q2, and is zero volt in the example shown in FIG. 4.

At this time, second middle voltage VM2 is zero, and so the channel part of lower arm Q2 opens slightly. As a result of this, the circulating current (freewheeling current) that flows in mode MD4 flows in both the channel part and the body diode of lower arm Q2. Consequently, in lower arm Q2 in mode MD4, the ON resistance of the channel part and the ON resistance of the body diode are connected in parallel. As a result of this, the drain-source voltage of lower arm Q2 decreases, so that the loss of lower arm Q2 decreases. Also, since a rectified current (freewheeling current) is shunted between the body diode and the channel part, the current to flow in the body diode decreases in proportion, and so the progress of deterioration due to the current flowing in the body diode can be suppressed.

The freewheeling current that flows through the channel part and the body diode of lower arm Q2 in mode MD4 flows to the load 300 as output current Iu. Since this freewheeling current is a current that is based on the inductance of the load 300 and the like, output current Iu decreases gradually while maintaining a positive value. This freewheeling current is a current that passes through the channel part and the body diode of lower arm Q2, and corresponds to drain current ID2 that flows from the source to the drain of lower arm Q2. On the other hand, in mode MD4, upper arm Q1 enters the OFF state, and so drain current ID1 of upper arm Q1 decreases down to 0 [A].

As described above, in mode MD4, when second dead time DT2 starts, the first drive circuit 21 changes the gate voltage of upper arm Q1 from first negative power supply voltage V1N to first middle voltage VM1. On the other hand, the second drive circuit 22 changes the gate voltage of lower arm Q2 from second positive power supply voltage V2P to second middle voltage VM2 when first dead time DT1 starts.

Subsequently, at time point t5, the switching operation of the power conversion device 101 for one phase switches from mode MD4 to mode MD1. In this mode MD1, as described earlier, upper arm Q1 enters the ON state, and lower arm Q2 remains in the OFF state.

In this mode MD1, command signal Q1*sig* is inverted from the low level to the high level, and command signal Q2*sig* maintains the low level. Consequently, upper arm Q1 switches from the OFF state to the ON state, drain-source voltage VDS1 of upper arm Q1 drops from first positive power supply voltage V1P to "0," and drain current ID1 rises in the positive direction from zero (the direction from the drain to the source).

On the low side, on the other hand, while lower arm Q2 remains in the OFF state, by turning upper arm Q1 on, a high dv/dt is generated in lower arm Q2 (that is, drain source voltage VDS2 rises sharply), and a reverse recovery current due to the high dv/dt flows into the body diode of lower arm Q2. After the reverse recovery current settles, drain current ID2 becomes zero.

As described above, in mode MD1, the first drive circuit 21 changes the gate voltage of upper arm Q1 from first middle voltage VM1 to first positive power supply voltage V1P when second dead time DT2 ends. On the other hand, the second drive circuit 22 changes the gate voltage of lower arm Q2 from second middle voltage VM2 to second negative power supply voltage V2N when second dead time DT2 ends.

Next, a more specific example configuration of the drive device will be described.

Figure 5:
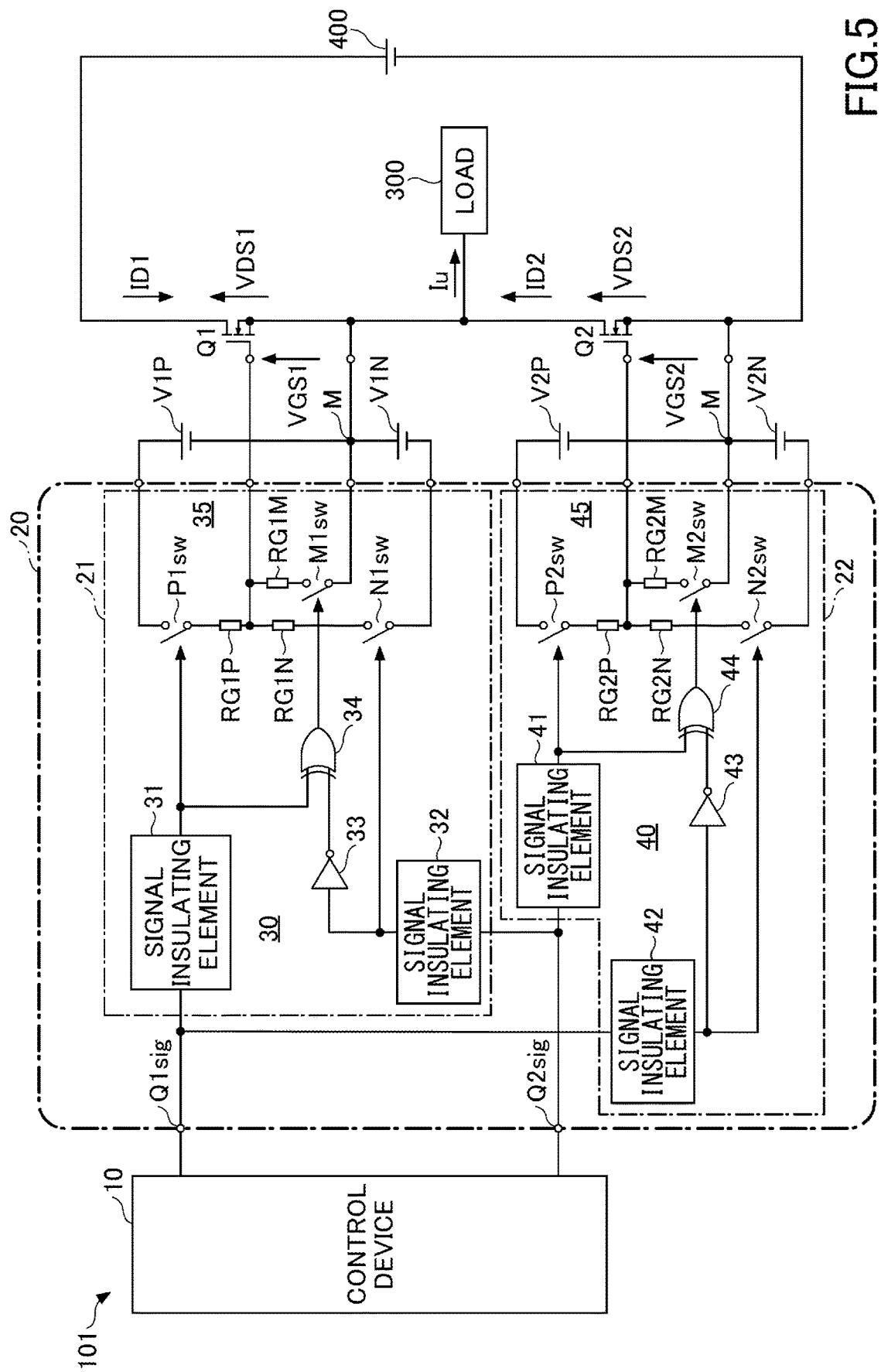
FIG. 5 is a diagram showing a first example configuration of a drive device included in a power conversion device according to one embodiment.

FIG. 5 is a diagram showing a first example configuration of the drive device included in the power conversion device according to one embodiment. The first drive circuit 21 has a first dead time detection circuit 30 that detects dead times DT1 and DT2 based on the command contents of command signals Q1*sig* and Q2*sig*. The second drive circuit 22 has a second dead time detection circuit 40 that detects dead times DT1 and DT2 based on the command contents of command signals Q1*sig* and Q2*sig*.

The first dead time detection circuit 30 includes signal isolating elements 31 and 32, an inversion circuit 33, and an exclusive OR gate 34. The second dead time detection circuit 40 includes signal isolating elements 41 and 42, an inversion circuit 43, and an exclusive OR gate 44. Each signal isolating element is a circuit that transfers and outputs input command signals, and is, for example, a photocoupler. Each inversion circuit inverts the logic of an input signal and outputs the resulting signal. The exclusive OR gate outputs the exclusive OR of two input logic levels.

Also, the first drive circuit 21 has a first gate drive circuit 35 that drives upper arm Q1 by utilizing the dead times detected by the first dead time detection circuit 30. The second drive circuit 22 has a second gate drive circuit 45 that drives lower arm Q2 by utilizing the dead times detected by the second dead time detection circuit 40.

The first gate drive circuit 35 has resistances RG1P, RG1N, and RG1M, and switches P1*sw*, N1*sw*, and M1*sw*. The second gate drive circuit 45 has resistances RG2P, RG2N, and RG2M, and switches P2*sw*, N2*sw*, and M2*sw*.

The first dead time detection circuit 30 turns on switch M1*sw* only during each period of dead times DT1 and DT2 detected. As a result of this, the first gate drive circuit 35 applies first middle voltage VM1, which has substantially zero voltage value, to the gate of upper arm Q1.

The second dead time detection circuit 40 turns on switch M2*sw* only during each period of dead times DT1 and DT2 detected. As a result of this, the second gate drive circuit 45 applies second middle voltage VM2, which has substantially zero voltage value, to the gate of lower arm Q2.

Note that, if there is a dead time that is known in advance, the drive device 20 may estimate dead times DT1 and DT2 by using a one-shot circuit or the like.

Figure 6:
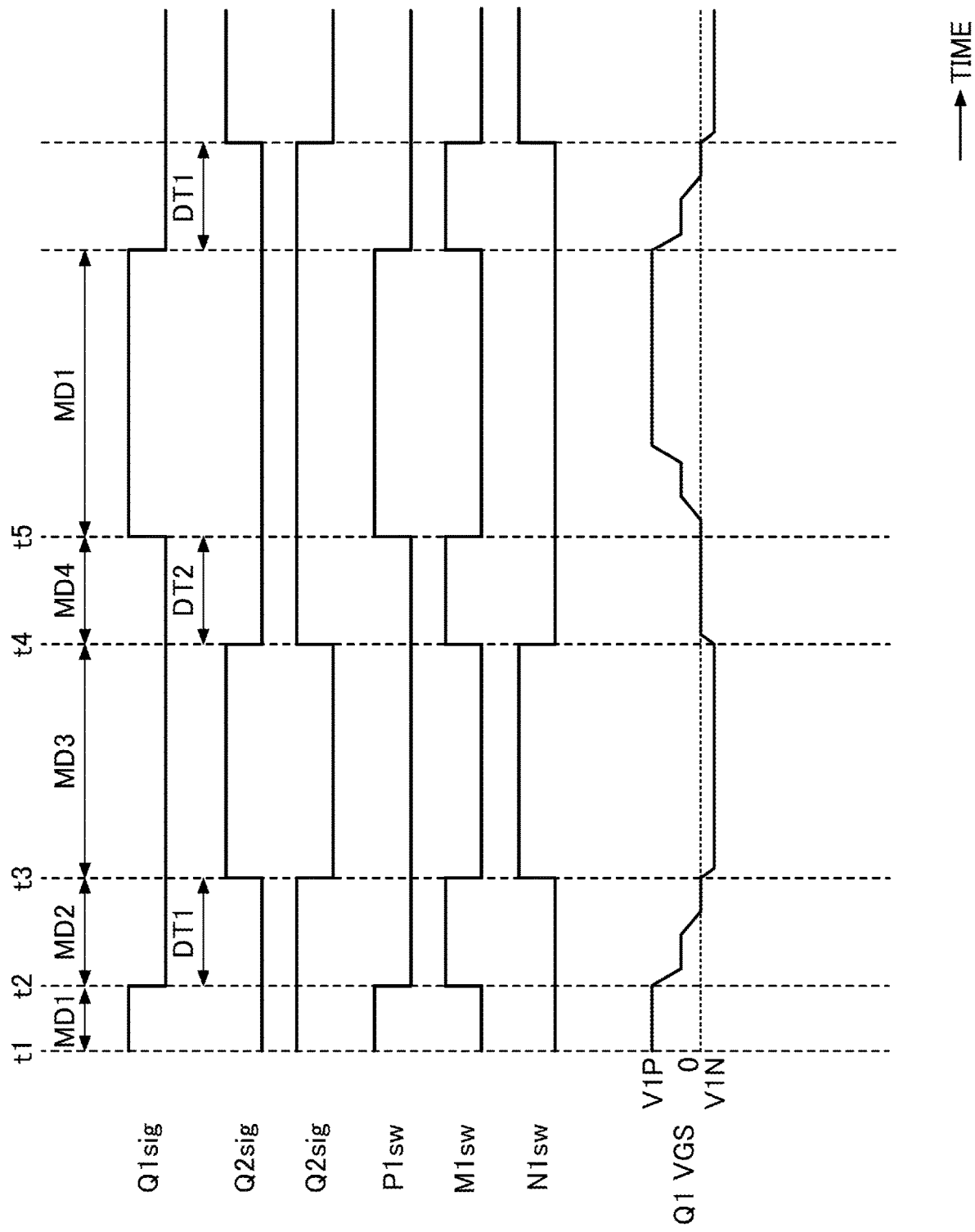
FIG. 6 is a timing chart showing an operation by a drive device having the configuration of FIG. 5.

FIG. 6 is a timing chart showing the operation of a drive device having the configuration of FIG. 5. Switch P1*sw* for outputting first positive power supply voltage V1P is turned on and off in accordance with command signal Q1*sig* input from the control device 10. Switch M1*sw* for outputting first middle voltage VM1 operates during dead times. Switch M1*sw* is turned on and off in accordance with the exclusive OR of Q1*sig* and the inverted signal of Q2*sig*. Switch N1*sw* for outputting first negative power supply voltage V1N is turned on and off in accordance with command signal Q2*sig* input from the control device 10. Operating in this way, switch N1*sw* can apply first middle voltage VM1 to the gate of upper arm Q1 during dead times. For lower arm Q2, also, the same operation as in FIG. 6 makes it possible to apply second middle voltage VM2 to the gate of lower arm Q2 during dead times.

Figure 7:
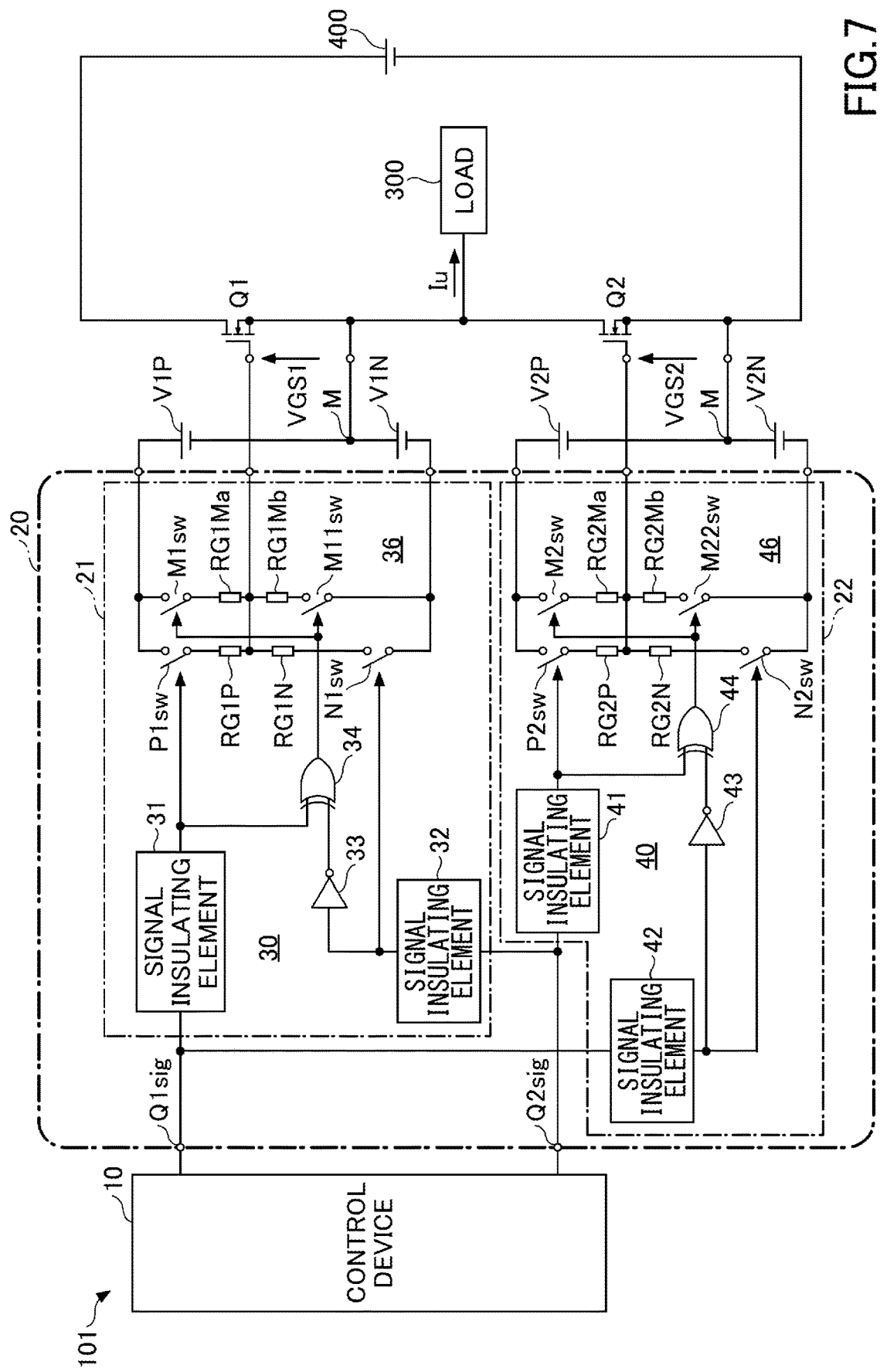
FIG. 7 is a diagram showing a second example configuration of the drive device included in the power conversion device according to one embodiment.

FIG. 7 is a diagram showing a second example configuration of a drive device included in the power conversion device according to one embodiment. The drive device 20 shown in FIG. 7 has a gate drive circuit that is different from that of the drive device 20 shown in FIG. 7. In FIG. 7, the first drive circuit 21 has a first gate drive circuit 36 that drives upper arm Q1 by utilizing the dead times detected by the first dead time detection circuit 30. The second drive circuit 22 has a second gate drive circuit 46 that drives lower arm Q2 by utilizing the dead times detected by the second dead time detection circuit 40.

The first gate drive circuit 36 has resistances RG1P, RG1N, RG1Ma, and RG1Mb, and switches P1*sw*, N1*sw*, M1*sw*, and M11*sw*. The second gate drive circuit 46 has resistances RG2P, RG2N, RG2Ma, and RG2Mb, and switches P2*sw*, N2*sw*, M2*sw*, and M22*sw*.

The first dead time detection circuit 30 turns on switches M1*sw* and M11*sw* only during each period of dead times DT1 and DT2 detected. As a result of this, the first gate drive circuit 36 divides the sum of the absolute value of the first positive power supply voltage and the absolute value of the first negative power supply voltage by resistance RG1Ma and resistance RG1Mb, into first middle voltage VM1, and applies this voltage value to the gate of upper arm Q1.

The second dead time detection circuit 40 turns on switches M2*sw* and M22*sw* only during each period of dead time DT1 and DT2 detected. As a result of this, the second gate drive circuit 46 divides the sum of the absolute value of the first positive power supply voltage and the absolute value of the first negative power supply voltage by resistance RG2Ma and resistance RG2Mb, into second middle voltage VM2, and applies this voltage value to the gate of lower arm Q2.

According to the configuration shown in FIG. 7, the first gate drive circuit 36 can not only apply first middle voltage VM1 having a voltage value of zero, but can also apply first middle voltage VM1 having a positive or negative voltage value, to upper arm Q1 during dead times. Similarly, the second gate drive circuit 46 can not only apply second middle voltage VM2 having a voltage value of zero, but can also apply second middle voltage VM2 having a positive or negative voltage value, to lower arm Q2 during dead times.

For example, first middle voltage VM1 may be a positive voltage that is higher than zero and lower than the first threshold voltage for upper arm Q1. Second middle voltage VM2 may be a positive voltage that is higher than zero and lower than the second threshold voltage for lower arm Q2. As a result of this, the middle voltage that is applied during dead times becomes a positive voltage at which the arm does not turn on. Consequently, the current to flow in the channel part also increases slightly, the gate-source voltage of the arm decreases, the loss is reduced, and the progress of deterioration is suppressed.

For example, first middle voltage VM1 may be a negative voltage that is higher than first negative power supply voltage V1N and lower than zero. Second middle voltage VM2 may be a negative voltage that is higher than second negative power supply voltage V2N and lower than zero. As a result of this, the middle voltage that is applied during dead times becomes a negative voltage at which the arm does not turn on. Consequently, it is possible to prevent the arms from being accidentally turned on during dead times due to noise or the like.

Next, the drive method (second drive method) for when the operation stops (both command signals Q1*sig* and Q2*sig* are OFF), and an example configuration (a third example configuration) of the drive device that executes this second drive method will be described below.

Figure 8:
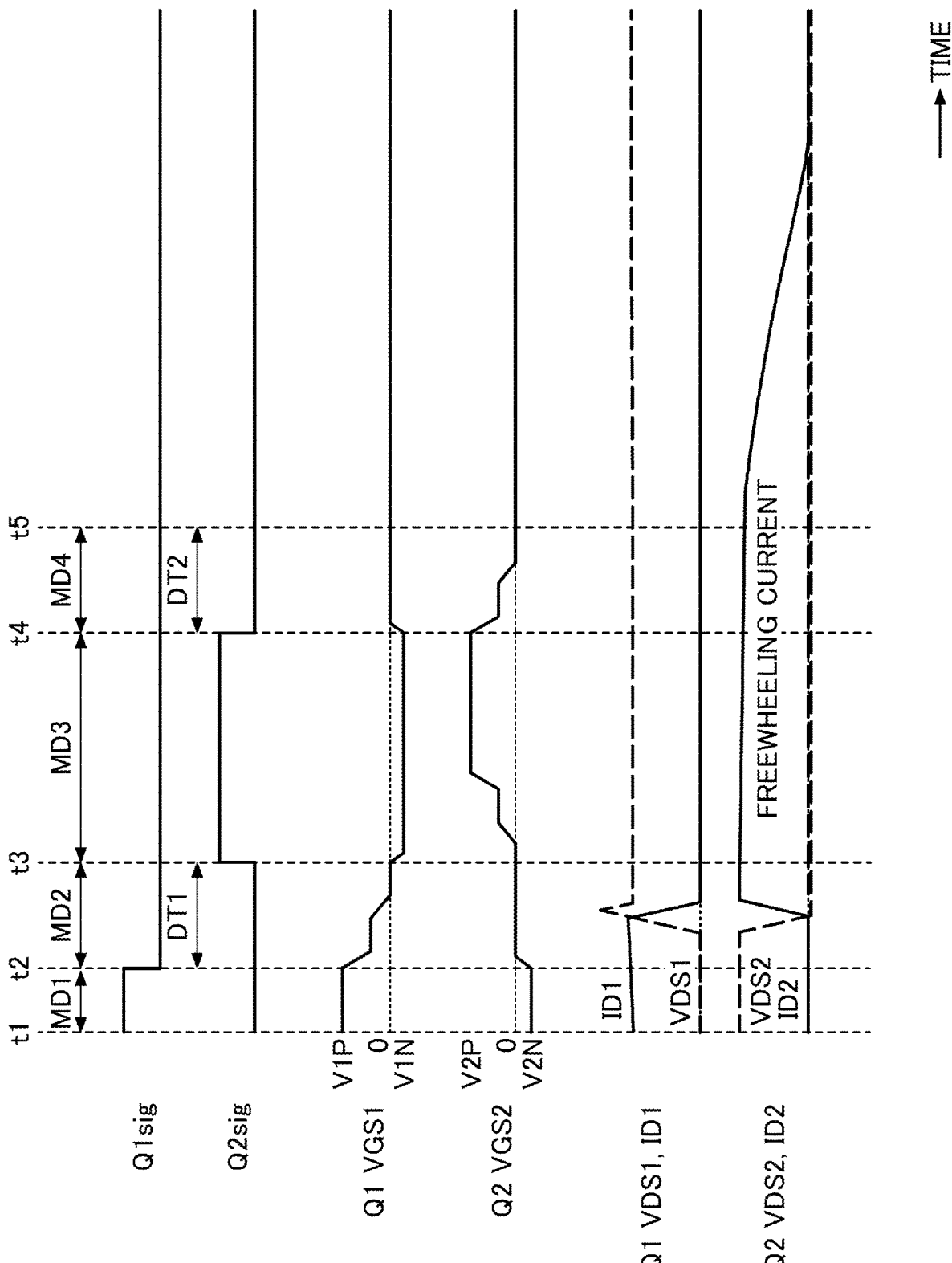
FIG. 8 is a timing chart showing an example of an operation waveform when the operation stops.

FIG. 8 is a timing chart showing an example of an operation waveform for when the operation stops. Normally, after dead time DT2, an ON command for upper arm Q1 by command signal Q1*sig* is input (see FIG. 4). However, if, for example, the conditions for stopping the operation are satisfied and the control device 10 stops operating in the middle, no ON command for upper arm Q1 by command signal Q1*sig* can be input (see FIG. 8). Consequently, gate-source voltage VGS1 of upper arm Q1 is held at first middle voltage VM1 (zero in the case of FIG. 8), and gate-source voltage VGS2 of lower arm Q2 is held at second middle voltage VM2 (zero in the case of FIG. 8). In this case, no reverse bias is applied between the gate and the source of upper arm Q1 or between the gate and the source of lower arm Q2 after time point t5, and therefore upper arm Q1 or lower arm Q2 might malfunction (for example, erroneously turn on) due to noise or the like. Although FIG. 8 illustrates a scene in which the operation stops after second dead time DT2 starts, when the operation stops after first dead time DT1 starts, similarly, upper arm Q1 or lower arm Q2 might malfunction (for example, erroneously turn on) due to noise or the like.

Figure 9:
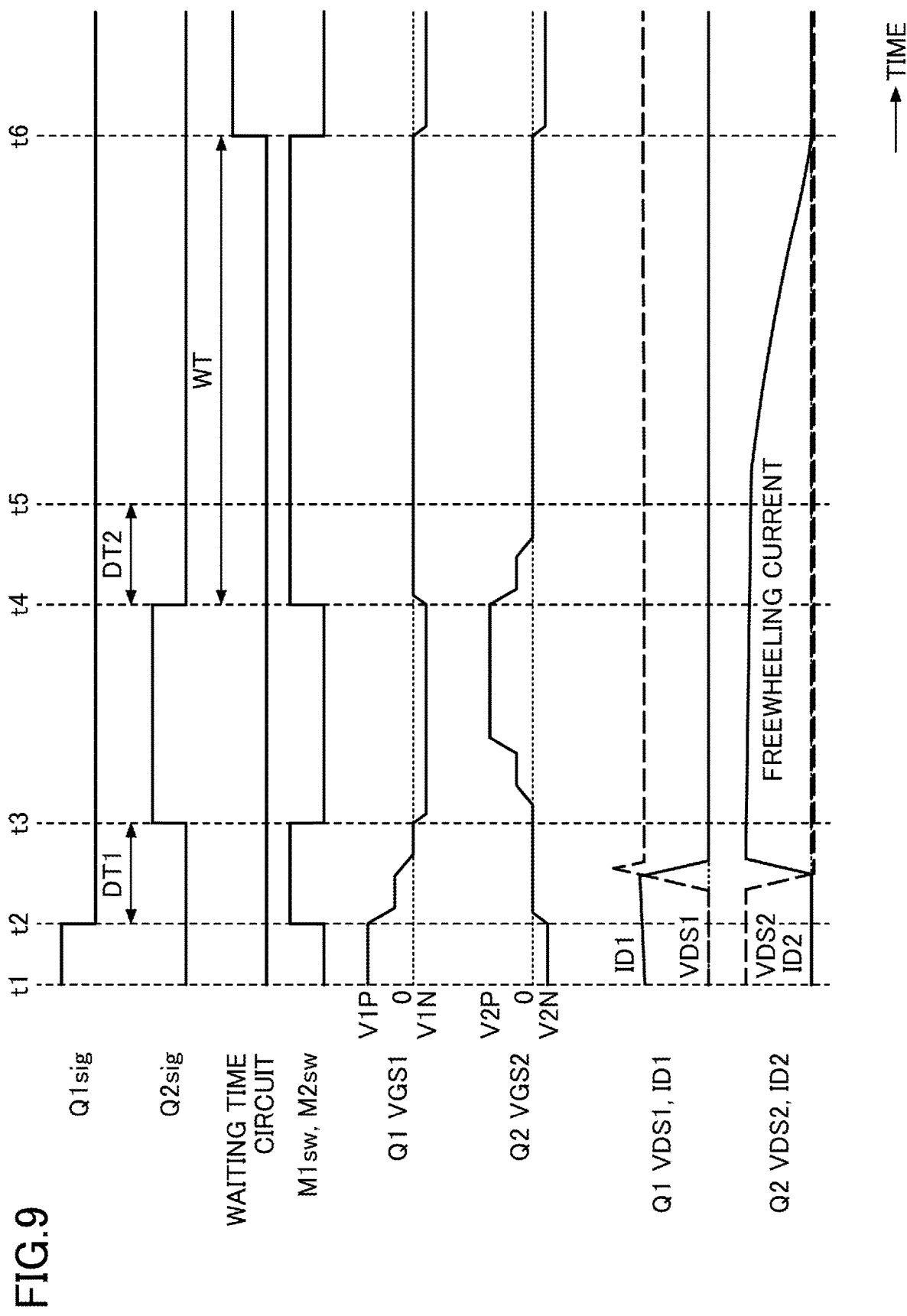
FIG. 9 is a timing chart showing an operation according to a second driving method of the present disclosure.

FIG. 9 is a timing chart showing the operation according to the second driving method of the present disclosure. FIG. 9 illustrates a scene in which the operation stops after time t4, which is when dead time DT2 starts. Note that, in the following description of FIG. 9, the reference codes and numerals of the power conversion device 101 shown in FIG. 1 will be used. Also, in the following description of the second driving method, the same contents as those of the first driving method will be omitted by referring to the above description.

When inputted OFF commands for both upper arm Q1 and lower arm Q2 exceed the set time for a dead time DT, the first drive circuit 21 sets the gate voltage of upper arm Q1 from first middle voltage VM1 (zero in this example) to first negative power supply voltage V1N (see time point t6). The OFF command for upper arm Q1 is an OFF command for upper arm Q1 by command signal Q1*sig*. The OFF command for lower arm Q2 is an OFF command for lower arm Q2 by command signal Q2*sig*. On the other hand, the second drive circuit 22 sets the gate voltage of lower arm Q2 from second middle voltage VM2 (zero in this example) to second negative power supply voltage V2N (see time point t6) when inputted OFF commands for both upper arm Q1 and lower arm Q2 exceed the set time for a dead time DT.

As a result of this, when an ON command for upper arm Q1 or lower arm Q2 is not input after the set time for dead time DT is over, a reverse bias is applied between the gate and the source of upper arm Q1 and between the gate and the source of lower arm Q2. As a result of this, the possibility that upper arm Q1 or lower arm Q2 malfunctions (for example, erroneously turns on) due to noise or the like can be reduced.

The set time for a dead time DT is a predetermined threshold time for allowing the drive device 20 to determine whether the length of the dead time DT determined by command signals Q1*sig* and Q2*sig* is good or not. Although the set time for a dead time DT is a threshold time shared in common between first dead time DT1 and second dead time DT2, the set time for first dead time DT1 and the set time for second dead time DT2 may be different threshold times.

Also, when a dead time DT exceeds a predetermined waiting time WT, the first drive circuit 21 may change the gate voltage of Q1 of the upper arm from first middle voltage VM1 (zero in this example) to first negative power supply voltage V1N (see time point t6). On the other hand, the second drive circuit 22 may change the gate voltage of lower arm Q2 from second middle voltage VM2 (zero in this example) to second negative power supply voltage V2N when a dead time DT exceeds predetermined waiting time WT (see time point t6).

As a result of this, for a certain period determined by the waiting time WT, gate-source voltage VGS1 of upper arm Q1 is maintained at first middle voltage VM1, and gate-source voltage VGS2 of lower arm Q2 is maintained at second middle voltage VM2. When a load 300 having an inductance such as an electric motor is connected when the operation stops, a freewheeling current flows in the body diode of upper arm Q1 or lower arm Q2 for a certain period. In the second drive method, the gate-source voltage is maintained at a middle voltage during the period in which current returns through the body diode, so that the ON voltage (forward voltage) of the body diode decreases. As a result of this, the loss of the body diode is reduced, and the deterioration of upper arm Q1 or lower arm Q2 can be suppressed.

For example, in FIG. 9, the first drive circuit 21 and the second drive circuit 22 measure the time that has passed since the ON-commanding period for lower arm Q2 ended at time point t4. When this measured value of elapsed time reaches a predetermined waiting time WT without input of an ON command for upper arm Q1, the first drive circuit 21 changes the gate voltage of upper arm Q1 from first middle voltage VM1 to first negative power supply voltage V1N. When the measured value of elapsed time reaches a predetermined waiting time WT without input of an ON command for upper arm Q1, the second drive circuit 22 changes the gate voltage of lower arm Q2 from second middle voltage VM2 to second negative power supply voltage V2N. By this means, the deterioration of upper arm Q1 or lower arm Q2 can be suppressed.

Similarly, although not explicitly shown in FIG. 9, the first drive circuit 21 and the second drive circuit 22 measure the time that has passed since the ON-commanding period for upper arm Q1 ended at time point t2. When this measured value of elapsed time reaches a predetermined waiting time WT without input of an ON command for lower arm Q2, the first drive circuit 21 changes the gate voltage of upper arm Q1 from first middle voltage VM1 to first negative power supply voltage V1N. When the measured value of elapsed time reaches a predetermined waiting time WT without input of an ON command for lower arm Q2, the second drive circuit 22 changes the gate voltage of lower arm Q2 from second middle voltage VM2 to second negative power supply voltage V2N. By this means, the deterioration of upper arm Q1 or lower arm Q2 can be suppressed.

Figure 10:
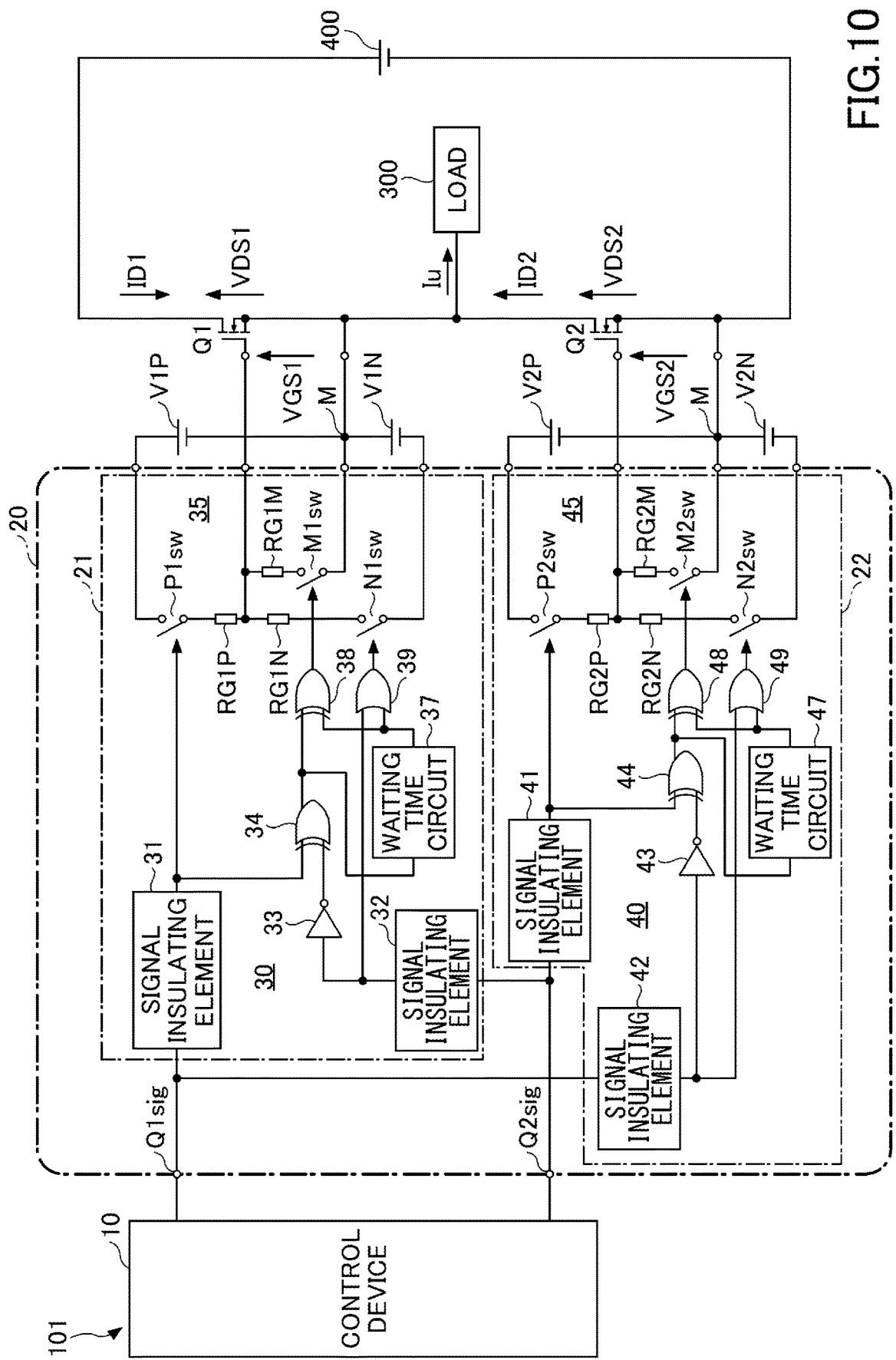
FIG. 10 is a diagram showing a third example configuration of the drive device included in the power conversion device according to one embodiment.

FIG. 10 is a diagram showing a third example configuration of the drive device included in the power conversion device according to one embodiment. In the description of the third example configuration shown in FIG. 10, the same configuration as the first example configuration shown in FIG. 5 will be omitted by referring to the above description. The third example configuration shown in FIG. 10 shows an example circuit configuration of the drive device that executes the above-described second driving method. The circuit configuration of the drive device that executes the second drive method is not limited to this configuration.

Compared to the first example configuration, the first dead time detection circuit 30 further includes a waiting time circuit 37, an exclusive OR gate 38, and an OR gate 39.

The waiting time circuit 37 is a delay circuit that delays the output signal of the exclusive OR gate 34, which turns on switch M1*sw* for applying first middle voltage VM1, by a waiting time WT, and outputs the resulting signal. The exclusive OR gate 38 drives switch M1*sw* by the exclusive OR of the output signal of the exclusive OR gate 34 and the output signal of the waiting time circuit 37. The OR gate 39 drives switch N1*sw* for outputting reverse bias, by the OR of the output signal of the signal insulation element 32 and the output signal of the waiting time circuit 37. Configured in this way, the first drive circuit 21 can turn off switch M1*sw* and turn on switch N1*sw* if no ON command by command signal Q1*sig* or Q2*sig* is input from the start of a dead time DT to the time the waiting time WT elapses. As a result of this, when the waiting time WT elapses without input of an ON command by command signal Q1*sig* or Q2*sig*, gate-source voltage VGS1 of upper arm Q1 can be changed from first middle voltage VM1 to first negative power supply voltage V1N.

Compared to the first example configuration, a second dead time detection circuit 40 further includes a waiting time circuit 47, an exclusive OR gate 48, and an OR gate 49.

The waiting time circuit 47 is a delay circuit that delays the output signal of the exclusive OR gate 44, which turns on switch M2*sw* for applying second middle voltage VM2, by a waiting time DT, and outputs the resulting signal. The exclusive OR gate 48 drives switch M2*sw* by the exclusive OR of the output signal of the exclusive OR gate 44 and the output signal of the waiting time circuit 47. The OR gate 49 drives switch N2*sw* for outputting reverse bias, by the OR of the output signal of the signal insulation element 42 and the output signal of the waiting time circuit 47. Configured in this way, the second drive circuit 22 can turn off switch M2*sw* and turn on switch N2*sw* if no ON command by command signal Q1*sig* or Q2*sig* is input from the start a dead time DT to the time the waiting time WT elapses. As a result of this, when the waiting time WT elapses without input of an ON command by command signal Q1*sig* or Q2*sig*, gate-source voltage VGS2 of lower arm Q2 can be changed from second middle voltage VM2 to second negative power supply voltage V2N.

Although an embodiment has been described above, the technique of the present disclosure is by no means limited to the above embodiment. Various modifications and improvements such as combination and replacement with some or all of other embodiments are possible.

Also, although a device for driving the elements of a two-level circuit, in which upper arm Q1 and lower arm Q2 are connected in series as arms for one phase, has been described with the above embodiment, the technique of the present disclosure may be applied to drive devices for driving the elements of a multi-level circuit having an output voltage level of 3 or higher.

The invention claimed is:

1. A drive device configured to switch between a first SiC-MOSFET (Silicon-Carbide Metal-Oxide-Semiconductor Field-Effect-Transistor) and a second SiC-MOSFET that are connected in series, the drive device providing a dead time during switching transitions, the dead time being a period during which both the first SiC-MOSFET and the second SiC-MOSFET are commanded to be OFF, the drive device comprising:
   a first drive circuit configured to set a gate voltage of the first SiC-MOSFET, during the dead time, to a first middle voltage that is higher than a first negative power supply voltage and lower than a first threshold voltage for the first SiC-MOSFET; and
   a second drive circuit configured to set a gate voltage of the second SiC-MOSFET, during the dead time, to a second middle voltage that is higher than a second negative power supply voltage and lower than a second threshold voltage for the second SiC-MOSFET;
   wherein:
   (i) when inputted OFF commands for both the first SiC-MOSFET and the second SiC-MOSFET exceed a set time of the dead time, the first drive circuit changes the gate voltage of the first SiC-MOSFET from the first middle voltage to the first negative power supply voltage, and the second drive circuit changes the gate voltage of the second SiC-MOSFET from the second middle voltage to the second negative power supply voltage; or
   (ii) wherein, when the dead time exceeds a predetermined waiting time, the first drive circuit changes the gate voltage of the first SiC-MOSFET from the first middle voltage to the first negative power supply voltage, and the second drive circuit changes the gate voltage of the second SiC-MOSFET from the second middle voltage to the second negative power supply voltage.

2. The drive device according to claim 1, wherein the dead time is a first dead time that is located immediately after a period in which the first SiC-MOSFET is commanded to be ON and immediately before a period in which the second SiC-MOSFET is commanded to be ON, wherein the first drive circuit changes the gate voltage of the first SiC-MOSFET from a first positive power supply voltage to the first middle voltage at a start of the first dead time, and changes the gate voltage of the first SiC-MOSFET from the first middle voltage to the first negative power supply voltage at an end of the first dead time, and wherein the second drive circuit changes the gate voltage of the second SiC-MOSFET from the second negative power supply voltage to the second middle voltage at the start of the first dead time, and changes the gate voltage of the second SiC-MOSFET from the second middle voltage to a second positive power supply voltage at the end of the first dead time.

3. The drive device according to claim 2, wherein the drive device provides a first dead time and a second dead time during the switching transitions, wherein the first dead time occurs immediately after the period in which the first SiC-MOSFET is commanded to be ON and immediately before the period in which the second SiC-MOSFET is commanded to be ON, and the second dead time occurs immediately after the period in which the second SiC-MOSFET is commanded to be ON and immediately before the period in which the first SiC-MOSFET is commanded to be ON, wherein the first drive circuit changes the gate voltage of the first SiC-MOSFET from the first negative power supply voltage to the first middle voltage at a start of the second dead time, and changes the gate voltage of the first SiC-MOSFET from the first middle voltage to the first positive power supply voltage at an end of the second dead time, and wherein the second drive circuit changes the gate voltage of the second SiC-MOSFET from the second positive power supply voltage to the second middle voltage at the start of the second dead time, and changes the gate voltage of the second SiC-MOSFET from the second middle voltage to the second negative power supply voltage at the end of the second dead time.

4. The drive device according to claim 1, wherein either the first middle voltage, the second middle voltage, or both is zero volt.

5. The drive device according to claim 1, wherein the first middle voltage is a positive voltage that is higher than zero and lower than the first threshold voltage, and wherein the second middle voltage is a positive voltage that is higher than zero and lower than the second threshold voltage.

6. The drive device according to claim 1, wherein the first middle voltage is a negative voltage that is higher than the first negative power supply voltage and lower than zero volt, and wherein the second middle voltage is a negative voltage that is higher than the second negative power supply voltage and lower than zero volt.

7. The drive device according to claim 1, wherein the waiting time includes a period in which a current returns through a body diode of the first SiC-MOSFET or the second SiC-MOSFET.

8. A power conversion device comprising the drive device of claim 1.

9. A drive method for switching between a first SiC-MOSFET (Silicon-Carbide Metal-Oxide-Semiconductor Field-Effect-Transistor) and a second SiC-MOSFET that are connected in series, the drive method providing a dead time during switching transitions, the dead time being a period during which both the first SiC-MOSFET and the second SiC-MOSFET are commanded to be OFF being provided in between, the drive method comprising:
   setting a gate voltage of the first SiC-MOSFET, during the dead time, to a first middle voltage that is higher than a first negative power supply voltage and lower than a first threshold voltage for the first SiC-MOSFET; and
   setting a gate voltage of the second SiC-MOSFET, during the dead time, to a second middle voltage that is higher than a second negative power supply voltage and lower than a second threshold voltage for the second SiC-MOSFET;

wherein:
(i) when inputted OFF commands for both the first SiC-MOSFET and the second SiC-MOSFET exceed a set time of the dead time, the gate voltage of the first SiC-MOSFET is changed from the first middle voltage to the first negative power supply voltage, and the gate voltage of the second SiC-MOSFET is changed from the second middle voltage to the second negative power supply voltage; or
(ii) wherein, when the dead time exceeds a predetermined waiting time, the gate voltage of the first SiC-MOSFET is changed from the first middle voltage to the first negative power supply voltage, and the gate voltage of the second SiC-MOSFET is changed from the second middle voltage to the second negative power supply voltage.

* * * * *